(12) United States Patent
Natarajan et al.

(10) Patent No.: US 6,955,777 B2
(45) Date of Patent: Oct. 18, 2005

(54) METHOD OF FORMING A PLATE FOR DISPENSING CHEMICALS

(75) Inventors: Govindarajan Natarajan, Pleasant Valley, NY (US); Umar Ahmad, Hopewell Junction, NY (US); Raschid J. Bezama, Mahopac, NY (US); James N. Humenik, LaGrangeville, NY (US); John U. Knickerbocker, Wappingers Falls, NY (US); Rao V. Vallabhaneni, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/338,093

(22) Filed: Jan. 7, 2003

(65) Prior Publication Data

US 2004/0129371 A1     Jul. 8, 2004

(51) Int. Cl.[7] ............................................. C04B 37/00
(52) U.S. Cl. ........................ 264/44; 264/610; 264/629
(58) Field of Search .................... 156/89.11, 89.23; 264/43, 44, 610, 629

(56) References Cited

U.S. PATENT DOCUMENTS

| | | | |
|---|---|---|---|
| 4,833,000 A * | 5/1989 | Trickett et al. ............. | 428/137 |
| 5,534,328 A | 7/1996 | Ashmead et al. ........... | 428/166 |
| 5,575,872 A | 11/1996 | Tsukada et al. ............. | 156/89 |
| 5,843,385 A | 12/1998 | Dugan ......................... | 422/191 |
| 5,961,930 A | 10/1999 | Chatterjee et al. .......... | 422/130 |
| 5,961,932 A | 10/1999 | Ghosh et al. ................ | 422/193 |
| 5,965,092 A | 10/1999 | Chatterjee et al. .......... | 422/130 |
| 5,976,472 A | 11/1999 | Chatterjee et al. .......... | 422/130 |
| 5,993,750 A | 11/1999 | Ghosh et al. ................ | 422/191 |
| 6,033,544 A | 3/2000 | Demers et al. ............. | 204/450 |
| 6,036,927 A | 3/2000 | Chatterjee et al. .......... | 422/211 |
| 6,527,890 B1 * | 3/2003 | Briscoe et al. ........... | 156/89.11 |

FOREIGN PATENT DOCUMENTS

| | | |
|---|---|---|
| EP | 0021659 A1 | 5/1980 |
| WO | WO 00/21659 | 4/2000 |
| WO | WO 01/41931 A2 | 6/2001 |
| WO | WO 01/41931 A3 | 6/2001 |

OTHER PUBLICATIONS

IBM Technical Disclosure Bulletin "Fluidic Logic Block" Mar. 1972, p 2862.

* cited by examiner

*Primary Examiner*—Steven P. Griffin
*Assistant Examiner*—Carlos Lopez
(74) *Attorney, Agent, or Firm*—Eric W. Petraske; James J. Cioffi

(57) ABSTRACT

A plate for use in mixing and testing materials in the pharmaceutical industry is formed by a method in which apertures in a set of greensheets are formed by a material removal process, at least some of the apertures being filled with a fugitive material that escapes during sintering.

13 Claims, 4 Drawing Sheets

METHOD OF FORMING A PLATE FOR DISPENSING CHEMICALS

TECHNICAL FIELD

The field of the invention is that of simultaneously testing many compounds for biological/chemical interactions. In particular, the current invention is a device/structure and a method to test drug interactions,

BACKGROUND OF THE INVENTION

In the pharmaceutical industry, it is necessary to test the reaction (including biological activity) of chemical A to chemicals $B_1$–$B_n$, where n can be a large number, on the order of millions.

A popular method is that of providing an array of substances $B_1$–$B_n$ on a plastic card and placing substance A in contact with each of the $B_n$. Commercially available plastic card arrays include 96 and 384 wells. The well diameters are of the order of few millimeters. The method of chemical placement or dispensing usually is by pipettes. There are computer assisted scanners used to type the chemical interactions.

Since there are millions of combinations of chemicals to test to exhaust the possibilities, it takes years for companies that are involved in drug discovery, to bring a successful drug to the market. With the current speed of computer assisted scanning devices, it is possible to reduce the drug discovery time, for example, by increasing the number of samples scanned at a time. This is possible if we can pack more number of wells, for example, in a given volume. A larger number of wells in a given volume also reduces the amount of costly chemicals to be used in a given well.

The plastic cards are usually formed by extrusion and the precision of the hole diameter and location within the array is not adequate enough to fabricate micro holes and channels. This essentially limits the extendability of plastic in this field.

The pharmaceutical industry is searching energetically for micro devices, with multiple thousands of wells with diameters of the order of 100 microns and channels connecting the selective wells at different levels within the array.

SUMMARY OF THE INVENTION

The invention relates to a ceramic device with micro wells and micro channels and a method for formation thereof.

A feature of the invention is the fabrication of an array of micro wells and micro channels in a ceramic structure by laminating multiple personalized green sheets.

In one aspect of the invention, the open wells and channels are formed by individual layer personalization.

In another aspect, a multi-layer array of wells and channel structure contains a set of structures filled with a material that will form channels after sintering.

Yet another feature of the invention is the use of material removal techniques to form wells, channels and such apertures.

Another feature of the invention is the use of a sacrificial material that escapes from the ceramic structure during the sintering process.

Another feature of the invention is the use of a sacrificial material that leaves no residue after sintering.

Another feature of the invention is the use of a sacrificial material that leaves a residue of a porous structure whose pores are connected after sintering.

Another aspect of the invention is the use of non-densifiable material (inorganic or metal or composites) to form channels in a densifiable matrix.

Another aspect of the invention is the control of the channel volume during sintering process.

Another aspect of the invention is the use of a material in the channel that leaves a coating due to chemical decomposition or vapor phase deposition.

DETAILED DESCRIPTION

Figure 1:
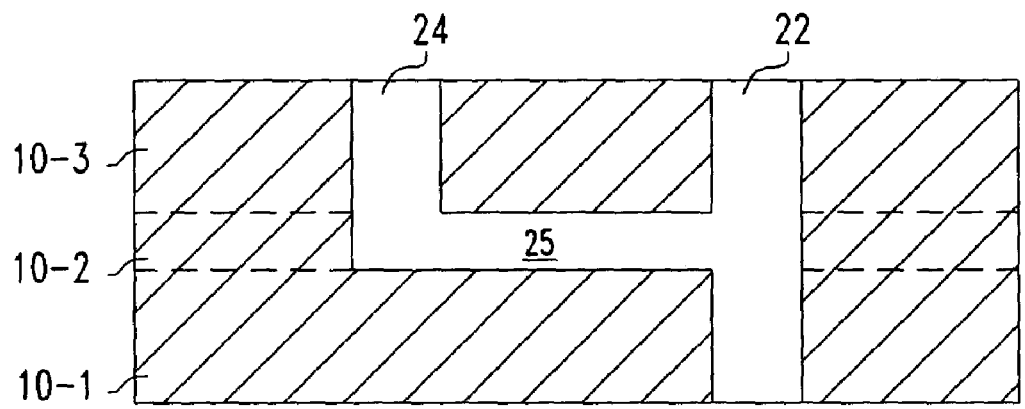
FIG. 1 shows a completed structure after a first version of the process.

FIG. 1 shows a portion of a simplified completed structure according to the invention, having a single horizontal channel 25 formed in a sheet 10-2 connecting a first vertical aperture 22 formed in sheets 10-1, 10-2 and 10-3 and a second aperture 24 formed in sheet 10-3. Sheets 10-1 to 10-3 were initially separate ceramic greensheets that have been laminated and sintered in a conventional process to form ceramic plate 10. In operation, a substance may be forced upward through sheet 10-1, diverge and exit in two locations in sheet 10-3. Similarly, the flow could be in the opposite direction, with two substances entering through two apertures in sheet 10-3, combining and exiting through the single opening in sheet 10-1.

FIG. 1 shows a structure formed using 3 green sheets and 1 horizontal channel connecting two vertical wells for simplicity in illustration. The structure has been assembled from individual sheets by lamination. The assembly process is the same for ceramic structures with arrays of thousands of holes, with thousands of horizontal channels selectively connected to link vertical holes. The ceramic material may include alumina, glass ceramic, aluminum nitride, borosilicate glass and glass. The diameter of vertical wells can be 20 microns or more, the channel width can be 20 microns or more and the length can be a minimum of 20 microns. The shape of a well exposing a substance may be circular, rectangular, smooth or rough. The total thickness of the plate 10 may be any desired amount, but preferably is under 1 mm. The thickness of the greensheet depends on the application, but preferably ranges from about 3 mils to about 30 mils.

The lamination process involves heat, pressure and time. The preferred lamination pressure is under 800 psi, the temperature is under 90 deg C. and for a time of less than 5 minutes. The sintering process involves the material of choice and the binder system used to form the greensheets.

Figure 2A:
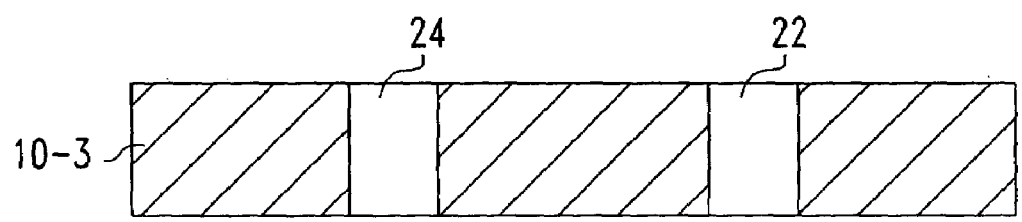
FIGS. 2–5 show steps in the first process.
Figure 2B:
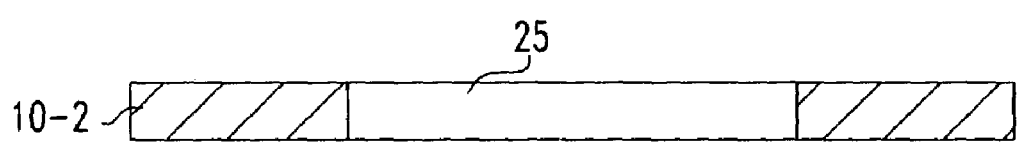
Figure 2C:
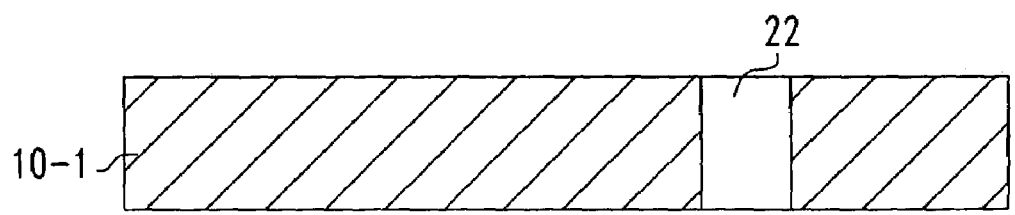
Figure 3:
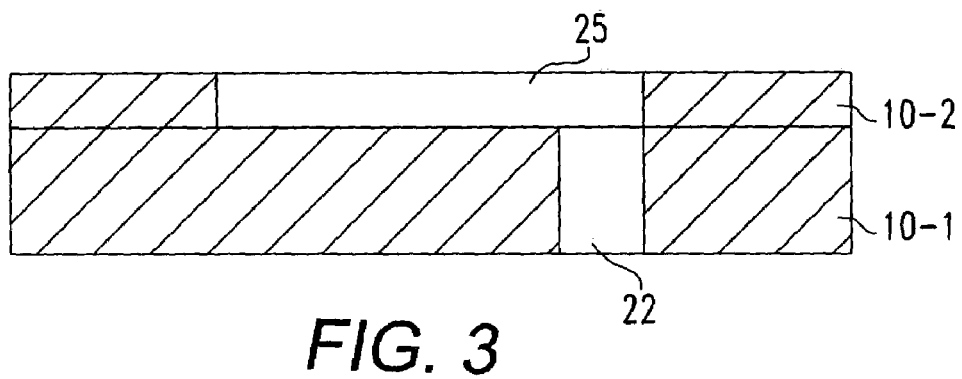
Figure 4:
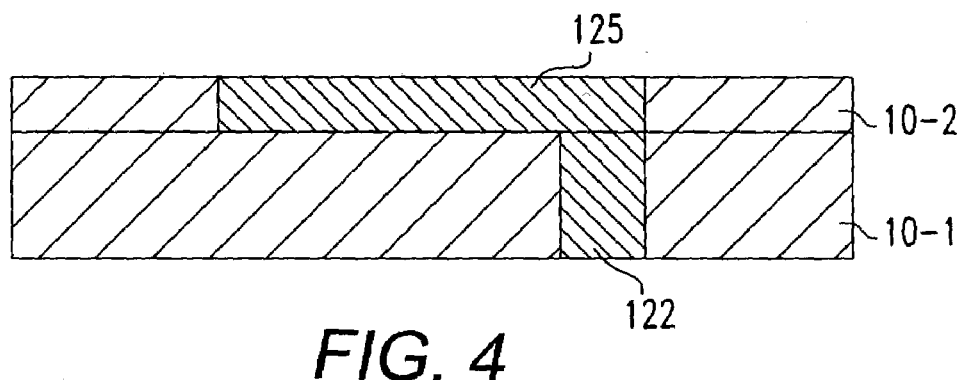
Figure 5:
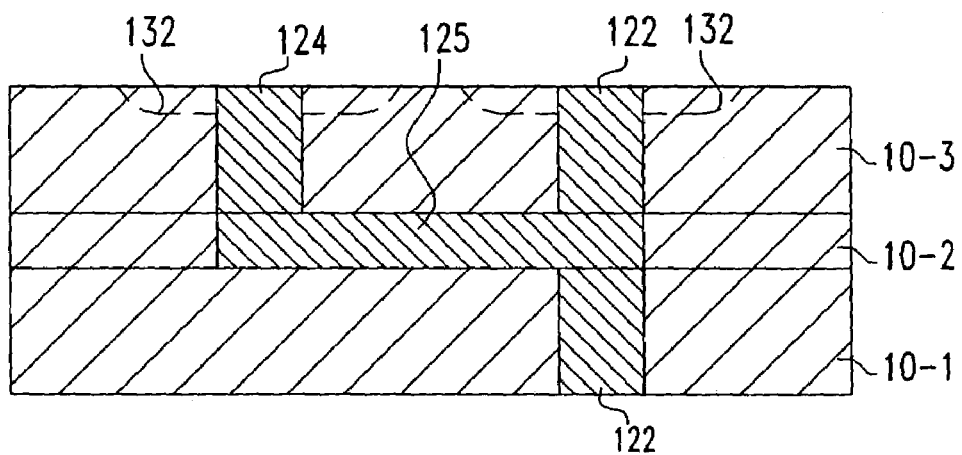

FIGS. 2A through 2C show the separate greensheets 10-1, 10-2 and 10-3 that have been laminated to form the structure of FIG. 1. Illustratively, horizontal channel 25 has a length greater than twice the diameter of an aperture 22 or 24. Illustratively, apertures 22 are about 20 microns or more in diameter. The diameter used in fabrication will depend on the particular application and technical variables such as the viscosity of the substance passing through, the surface tension/activity of the surface and fluid, desired flow force, capillary or forced flow, desired quantity and rate of flow, etc.

According to the invention, the greensheets are formed from a substance such as alumina, glass, ceramic and glass and ceramic. The technique for forming vertical apertures and horizontal channels is material removal by techniques such as punching the material out including nibbling, laser drilling, e-beam drilling, sandblasting and high pressure liquid jets.

Micromolding by pressing the material to the side and distorting the greensheet is not included in the preferred embodiments and will be referred to generally as a material displacement technique. Such techniques are undesirable, since the desired well and channel position accuracy with respect to each other is very small, e.g. a few microns, and the distortions introduced by material displacement techniques are a significant obstacle to providing the desired accuracy.

The fugitive materials for the first embodiment may be any compatible organic material such as terepthalic acid, carbon, or other organic materials.

The materials to form the porous structures in the second embodiment may be ceramics such as alumina, glass ceramic, aluminum nitride and borosilicate glass, illustratively in a particle size of less than 40 microns.

The horizontal and vertical apertures may be left open if there is no concern that pressures during handling or other operations will distort them, or they may be filled with a fugitive material.

In a first embodiment of the invention, the fugitive material is one that leaves no residue after it leaves. The process of removing the fugitive material may involve heating it past the boiling or subliming temperature, so that the material goes off in vapor form into the ambient; or the technique may involve burning or other chemical reaction that combines the molecules of the fugitive material with the molecules of a reactant gas to from a substance that is a gas and goes into the ambient. The form of the fugitive material is preferably one that is easy to apply into the apertures in the greensheet, e.g. in the form of a paste.

In the second embodiment, the fugitive material is combined with a second material that will form a porous structure on being sintered; e.g. a mixture of fugitive material in particle form, the particle size being sufficiently large that the particles touch in the unfired state. Therefore, a continuous open structure will remain in an open-pore matrix after sintering to permit the passage of a test material through the pores from one side of the plate 10 to the other. It should also be obvious that the unsintered porous body in the channel will allow to form controlled open volume and channel dimensions. Also, the unsintered porous body in the channel help from channel collapse during sintering process.

Figure 6:
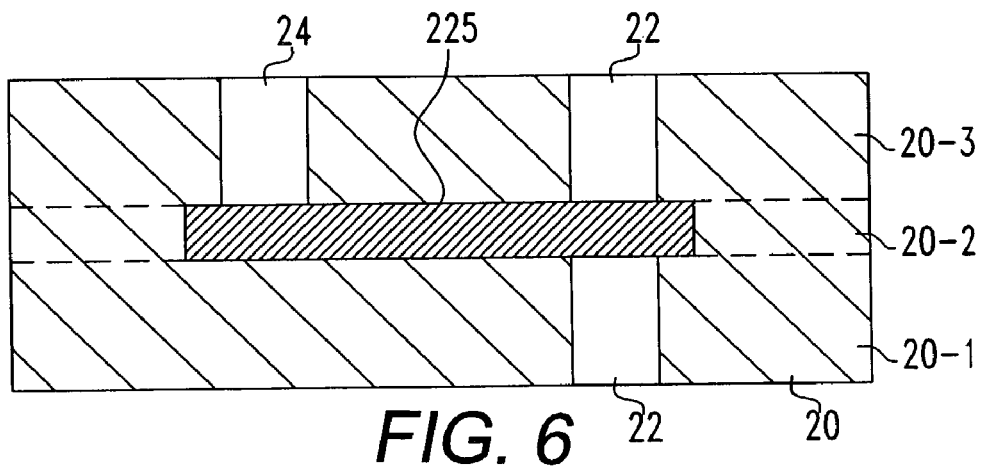
FIG. 6 shows a completed structure after a second version of the process.

FIG. 6 is a counterpart to FIG. 1, showing a completed structure in which vertical apertures are open, having been filled with a fugitive material before sintering and the horizontal channel has a porous matrix. Horizontal channel 225 was filled before sintering with a filler material that is a mixture of the fugitive material and a matrix material that sinters to form a porous matrix having open pores that permit the passage of a fluid through it from vertical aperture 22 to vertical aperture 24.

Figure 7A:
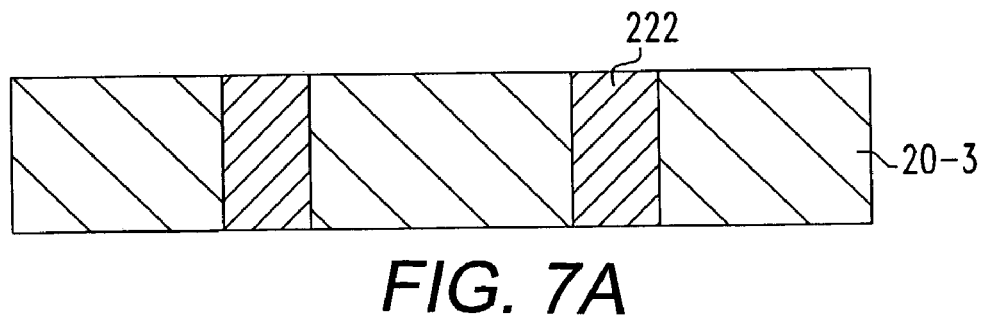
FIGS. 7–10 show steps in the second process.
Figure 7B:
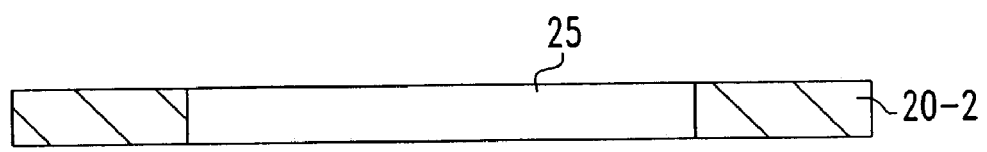
Figure 7C:
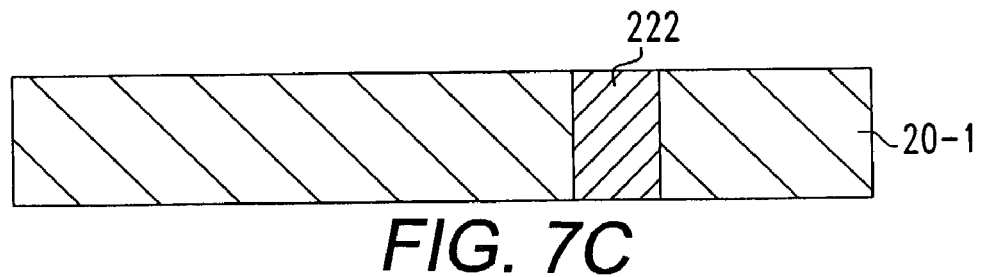

FIGS. 7A and 7C show greensheets 20-1 and 20-2 filled with the same fugitive material 222 used in the previous example. FIG. 7B shows greensheet 20-2 with the aperture empty.

Figure 8:
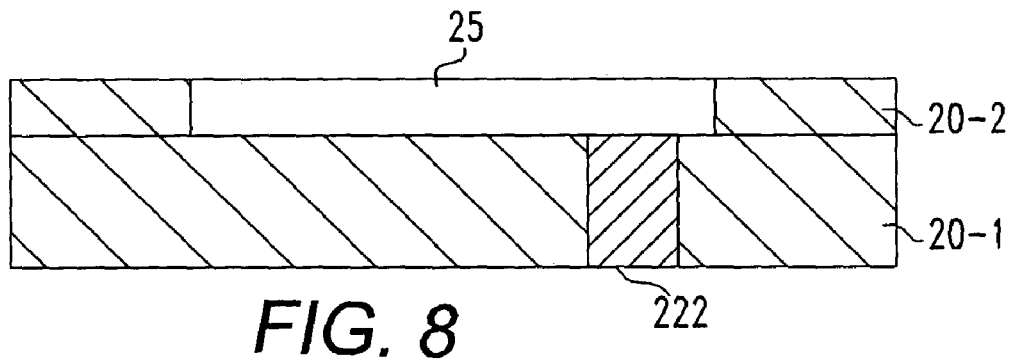
Figure 9:
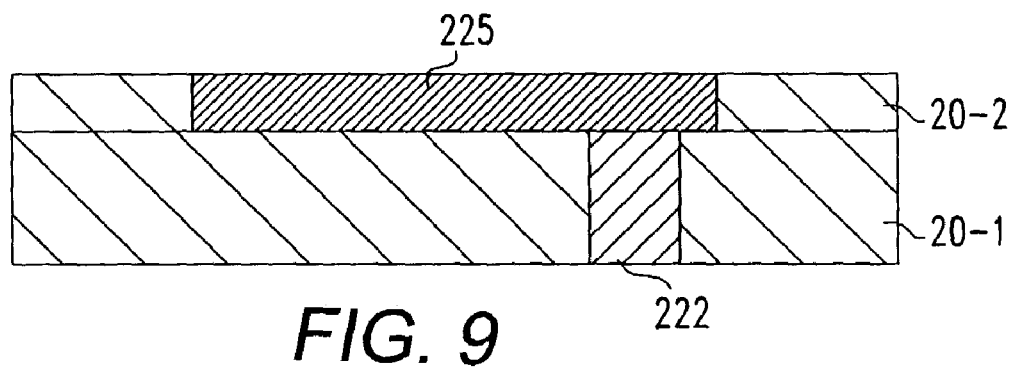
Figure 10:
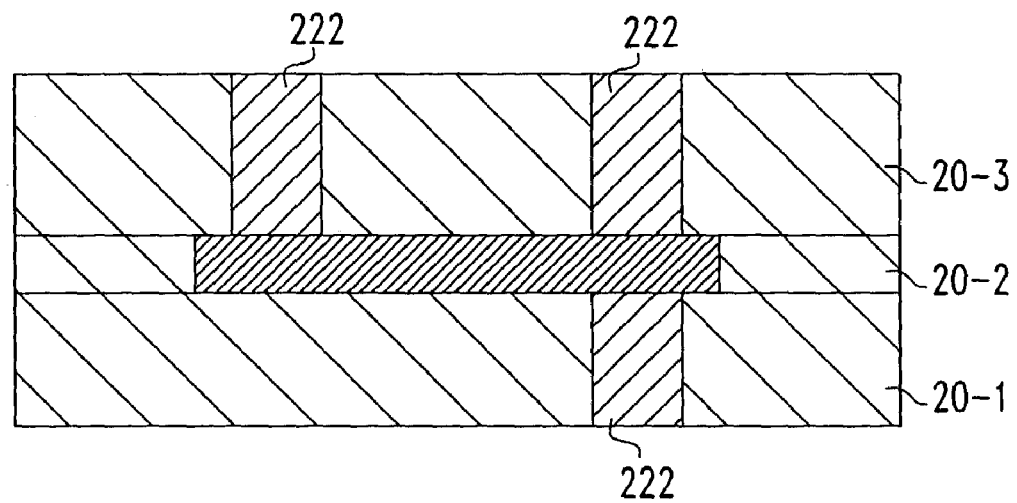

FIG. 8 shows a sublaminate of sheet 20-1 and 20-2. FIG. 9 shows the horizontal aperture having been filled with the filler material 225. Illustratively, the material 225 is a blend of the fugitive material with particles listed above that will sinter to form an open-pore structure. At the designer's option, the vertical passages may also be filled with the porous material to achieve a design objective. FIG. 10 shows the final structure before sintering.

Alternative forms of the invention include using a densifiable material for the greensheets and filling the openings with a non-densifiable material in order to preserve the dimensions of the passages. For example, the matrix material may be an inorganic phase like alumina mixed with glass frit for densification, whereas the non-densifiable phase in the channel (and or holes) could be just larger ceramic particles like alumina.

Additionally, the material in the passages may be one that forms a non-porous sheath on being sintered, so that the passages receive a liner, such as that the sheath has alternate surface energy/activity than the matrix material/the body of the plate 10. The material for the sheath can be inorganic, metal or composite. The sheath formation may be due to chemical decomposition between a first material in the laminate and a second material in the filler or in the ambient gas and/or the sheath formation may be due to vapor phase deposition. As another option, the liner could be produced by a vapor emitted by the filler material that deposits on the walls or reacts with a material contained in the laminate.

While the invention has been described in terms of a several preferred embodiments, those skilled in the art will recognize that the invention can be practiced in various versions within the spirit and scope of the following claims.

What is claimed is:

1. A method of forming a plate for the substantially direct passage through a set of apertures of a precision volume of at least one liquid substance from a first side to a second side comprising the steps of:

forming a plurality of vertical apertures in a first ceramic greensheet by a material removal technique;

forming a plurality of horizontal apertures in a second ceramic greensheet by a material removal technique;

forming a plurality of vertical apertures in a third ceramic greensheet by a material removal technique, in which at least some of said horizontal apertures in said second greensheet connect a first aperture in said first greensheet extending in a substantially straight line through said third greensheet with a related aperture in said third greensheet so that a substance entering one of said apertures in said first ceramic greensheet exits in both said first aperture and said related aperture;

filling at least some of said apertures with a filler material containing a fugitive material;

laminating said first, second and third ceramic greensheets together; and sintering said first, second and third greensheets, thereby forming said plate and releasing said fugitive material, in which:

said fugitive material combines with material in said greensheets, leaving a residue during a sintering process that forms a non-porous liner on the interior of said vertical apertures in said first and third greensheets and said horizontal apertures in said second greensheet, whereby said liquid does not react with said first second or third ceramic greensheet.

2. A method according to claim 1, in which:

said second greensheet is laminated together with one of said first and third greensheets to form a sublaminate before a further step of filling said apertures with said fugitive material.

3. A method according to claim 1, in which:
apertures in each of said first, second and third greensheets are filled with said fugitive material before a step of laminating with another of said greensheets.

4. A method according to claim 1, in which:
said first second and third greensheets are formed from a densifiable material and said first and second vertical apertures in said first and third greensheets and said horizontal apertures in said second greensheet are filled with a porous non-densifiable material, whereby the dimensions of said vertical and horizontal apertures are preserved during said step of sintering.

5. A method of forming a plate for the substantially direct passage through a set of apertures of a precision volume of at least one liquid substance from a first side to a second side comprising the steps of:
forming a plurality of vertical apertures in a first ceramic greensheet by a material removal technique;
forming a plurality of horizontal apertures in a second ceramic greensheet by a material removal technique;
forming a plurality of vertical apertures in a third ceramic greensheet by a material removal technique, in which at least some of said horizontal apertures in said second greensheet connect a first aperture in said first greensheet extending in a substantially straight line through said third greensheet with a related aperture in said third greensheet so that a substance entering one of said apertures in said first ceramic greensheet exits in both said first aperture and said related aperture;
filling at least some of said apertures in each of said first, second and third greensheets with a filler material containing a fugitive material before a step of laminating with another of said greensheets;
laminating said first, second and third ceramic greensheets together; and
sintering said first, second and third greensheets, thereby forming said plate and releasing said fugitive material and apertures in each of said first, second and third greensheets are filled with said fugitive material before a step of laminating with another of said greensheets, in which:
said filler material filling said apertures is a mixture of a fugitive material that combines with material in said greensheets, leaving a residue that forms a non-porous liner on the interior of said vertical apertures in said first and third greensheets and said horizontal apertures in said second greensheet during a sintering process and a matrix material that leaves a porous matrix after said sintering process.

6. A method according to claim 5, in which:
said fugitive material is selected from the group consisting of:
terepthalic acid and carbon.

7. A method according to claim 5, in which:
said fugitive material is selected from the group consisting of:
terepthalic acid and carbon; and
said matrix material is selected from the group consisting of:
alumina, glass ceramic, aluminum nitride, and borosilicate glass.

8. A method of forming a plate for the substantially direct passage through a set of apertures of at least one liquid substance from a first side to a second side comprising the steps of:
forming a plurality of vertical apertures in a first ceramic greensheet by a material removal technique;
forming a plurality of horizontal apertures in a second ceramic greensheet by a material removal technique;
forming a plurality of vertical apertures in a third ceramic greensheet by a material removal technique, in which at least some of said horizontal apertures in said second greensheet connect a first aperture in said first greensheet extending in a substantially straight line through said third greensheet with a related aperture in said third greensheet so that a substance entering one of said apertures in said first ceramic greensheet exits in both said first aperture and said related aperture and at least some corresponding horizontal apertures connected to said apertures in said first and third greensheets are filled with a mixture of a fugitive material that escapes without leaving a residue during a sintering process and a matrix material that leaves a porous matrix after said sintering process, so that a flow of said substance through said corresponding horizontal apertures passes through said porous matrix;
laminating said first, second and third ceramic greensheets together;
and sintering said first, second and third greensheets.

9. A method according to claim 8, in which:
said second greensheet is laminated together with one of said first and third greensheets to form a sublaminate.

10. A method of forming a plate for the substantially direct passage through a set of apertures of a precision volume of at least one liquid substance from a first side to a second side comprising the steps of:
forming a plurality of vertical apertures in a first ceramic greensheet by a material removal technique;
forming a plurality of horizontal apertures in a second ceramic greensheet by a material removal technique;
forming a plurality of vertical apertures in a third ceramic greensheet by a material removal technique, in which at least some of said horizontal apertures in said second greensheet connect a first aperture in said first greensheet extending in a substantially straight line through said third greensheet with a related aperture in said third greensheet so that a substance entering one of said apertures in said first ceramic greensheet exits in both said first aperture and said related aperture;
filling at least some of said apertures with a filler material containing a frigitive material;
laminating said first, second and third ceramic greensheets together; and
sintering said first, second and third greensheets, thereby forming said plate and releasing said fugitive material, in which:
at least some of said apertures in said first and third greensheets are not filled with said fugitive material and corresponding horizontal apertures connected to said apertures in said first and third greensheets are filled with a mixture of a fugitive material that escapes without leaving a residue during a sintering process and a matrix material that leaves a porous matrix after said sintering process, so that a flow of said substance through said corresponding horizontal apertures passes through said porous matrix.

11. A method of forming a plate for the substantially direct passage through a set of apertures of a precision volume of at least one liquid substance from a first side to a second side comprising the steps of:
forming a plurality of vertical apertures in a first ceramic greensheet by a material removal technique;
forming a plurality of horizontal apertures in a second ceramic greensheet by a material removal technique;

forming a plurality of vertical apertures in a third ceramic greensheet by a material removal technique, in which at least some of said horizontal apertures in said second greensheet connect a first aperture in said first greensheet extending in a substantially straight line through said third greensheet with a related aperture in said third greensheet so that a substance entering one of said apertures in said first ceramic greensheet exits in both said first aperture and said related aperture;

filling at least some of said apertures with a filler material containing a fugitive material and at least some of said apertures in said first and third greensheets are not filled with said fugitive material and corresponding horizontal apertures connected to said apertures in said first and third greensheets are filled with a mixture of a fugitive material that escapes without leaving a residue during a sintering process and a matrix material that leaves a porous matrix after said sintering process, so that a flow of said substance through said corresponding horizontal apertures passes through said porous matrix;

laminating said first, second and third ceramic greensheets together; and sintering said first, second and third greensheets, thereby forming said plate and releasing said fugitive material; in which:

said fugitive material combines with material in said greensheets, leaving a residue during a sintering process that forms a non-porous liner on the interior of said vertical apertures in said first and third greensheets and said horizontal apertures in said second greensheet.

12. A method of forming a plate for the substantially direct passage through a set of apertures of a precision volume of at least one liquid substance from a first side to a second side comprising the steps of:

forming a plurality of vertical apertures in a first ceramic greensheet by a material removal technique;

forming a plurality of horizontal apertures in a second ceramic greensheet by a material removal technique;

forming a plurality of vertical apertures in a third ceramic greensheet by a material removal technique, in which at least some of said horizontal apertures in said second greensheet connect a first aperture in said first greensheet extending in a substantially straight line through said third greensheet with a related aperture in said third greensheet so that a substance entering one of said apertures in said first ceramic greensheet exits in both said first aperture and said related aperture;

filling at least some of said apertures with a filler material containing a fugitive material;

laminating said first, second and third ceramic greensheets together; and sintering said first, second and third greensheets, thereby forming said plate and releasing said fugitive material, in which:

said fugitive material combines with material in said greensheets, leaving a residue during a sintering process that forms a non-porous liner on the interior of said vertical apertures in said first and third greensheets and said horizontal apertures in said second greensheet.

13. A method of forming a plate for the substantially direct passage through a set of apertures of a precision volume of at least one liquid substance from a first side to a second side comprising the steps of:

forming a plurality of vertical apertures in a first ceramic greensheet by a material removal technique;

forming a plurality of horizontal apertures in a second ceramic greensheet by a material removal technique;

forming a plurality of vertical apertures in a third ceramic greensheet by a material removal technique, in which at least some of said horizontal apertures in said second greensheet connect a first aperture in said first greensheet extending in a substantially straight line through said third greensheet with a related aperture in said third greensheet so that a substance entering one of said apertures in said first ceramic greensheet exits in both said first aperture and said related aperture;

filling at least some of said apertures with a filler material containing a fugitive material;

laminating said first, second and third ceramic greensheets together; and sintering said first, second and third greensheets, thereby forming said plate and releasing said fugitive material, in which:

said filler material filling said apertures is a mixture of a fugitive material that combines with material in said greensheets, leaving a residue that forms a non-porous liner on the interior of said vertical apertures in said first and third greensheets and said horizontal apertures in said second greensheet during a sintering process and a matrix material that leaves a porous matrix after said sintering process.

* * * * *